(12) United States Patent
Ben-Bassat et al.

(10) Patent No.: US 9,520,890 B1
(45) Date of Patent: Dec. 13, 2016

(54) DUAL DIGITAL TO TIME CONVERTER (DTC) BASED DIFFERENTIAL CORRELATED DOUBLE SAMPLING DTC CALIBRATION

(71) Applicant: Intel IP Corporation, Santa Clara, CA (US)

(72) Inventors: Assaf Ben-Bassat, Haifa (IL); Ashoke Ravi, Hillsboro, OR (US); Ofir Degani, Haifa (IL)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/998,238

(22) Filed: Dec. 23, 2015

(51) Int. Cl.
- H03M 1/06 (2006.01)
- H03M 1/10 (2006.01)
- G04F 10/00 (2006.01)
- H03M 1/82 (2006.01)

(52) U.S. Cl.
CPC .......... *H03M 1/1014* (2013.01); *G04F 10/005* (2013.01); *H03M 1/82* (2013.01)

(58) Field of Classification Search
CPC .. H03M 1/1071; H03M 2201/63; H03M 3/38; H03M 1/1014; H03M 1/82; H03M 1/10; H03M 1/1009; G04F 10/005
USPC .......................................... 341/118, 145, 120
See application file for complete search history.

(56) References Cited

U.S. PATENT DOCUMENTS

| | | | |
|---|---|---|---|
| 4,742,331 A | 5/1988 | Barrow et al. | |
| 5,489,864 A * | 2/1996 | Ashuri | H03K 5/131 327/105 |
| 8,222,966 B2 | 7/2012 | Ravi et al. | |
| 8,362,815 B2 * | 1/2013 | Pavlovic | H03L 7/081 327/156 |
| 8,497,716 B2 * | 7/2013 | Zhang | H03L 7/1976 327/147 |
| 2011/0156783 A1 * | 6/2011 | Pavlovic | H03L 7/081 327/159 |
| 2013/0093471 A1 * | 4/2013 | Cho | H03L 7/081 327/107 |
| 2014/0002288 A1 | 1/2014 | Scholz | |

(Continued)

OTHER PUBLICATIONS

Jiayoon Zhiyu Ru, et al.; "A High-Linearity Digital-to-Time Converter Technique: Constant-Slope Charging", IEEE Journal of Solid-State Circuits, vol. 50, No. 6, Jun. 2015, p. 1412-1423.

(Continued)

*Primary Examiner* — Jean B Jeanglaude
(74) *Attorney, Agent, or Firm* — Eschweiler & Associates, LLC

(57) ABSTRACT

A system for calibrating a digital to time converter (DTC), includes a first DTC configured to receive a first digital input code and generate a first DTC output signal, and a second DTC configured to receive a second digital input code and generate a second DTC output signal. Further, the system includes a delay circuit configured to apply a first delay to the first DTC output signal to generate a first delayed DTC output signal and a phase detector circuit configured to determine a phase difference between the first delayed DTC output signal and the second DTC output signal, thereby generating a phase detector output. In addition, the system includes a calibration circuit configured to adjust the first digital input code of the first DTC to an adjusted first code that minimizes the phase detector output, based on a search algorithm.

25 Claims, 9 Drawing Sheets

(56) References Cited

U.S. PATENT DOCUMENTS

| | | | |
|---|---|---|---|
| 2014/0176201 A1* | 6/2014 | Weltin-Wu | H03L 7/197 327/115 |
| 2014/0266822 A1* | 9/2014 | Henzler | G04F 10/005 341/118 |
| 2014/0266837 A1* | 9/2014 | Henzler | H03M 1/82 341/145 |
| 2015/0036767 A1 | 2/2015 | Degani et al. | |
| 2015/0188583 A1 | 7/2015 | Ravi et al. | |

OTHER PUBLICATIONS

Texas Instruments; "Understanding Data Converters: Application Report", Mixed-Signal Products SLAA013, 1995, p. 1-22.

Gordon Roberts; "A Brief Introduction to Time-to-Digital and Digital-to-Time Converters"; ResearchGate; http://www.researchgate.net/publication/224126917, p. 6.

U.S. Appl. No. 14/861,132, filed Sep. 22, 2015 with the U.S. Patent and Trademark Office.

\* cited by examiner

US 9,520,890 B1

DUAL DIGITAL TO TIME CONVERTER (DTC) BASED DIFFERENTIAL CORRELATED DOUBLE SAMPLING DTC CALIBRATION

FIELD

The present disclosure relates to digital to time converters (DTCs) and, in particular to a method for calibrating DTCs using dual DTC based correlated double sampling.

BACKGROUND

Digital to time converters (DTCs) are a very promising solution for a number of applications such as digital polar transmitters, fractional-n clocking or others. Due to improved system key performance indicators (KPI)s that DTCs enable even more applications apply, such as improving radio transmitter efficiency, support for wide-bandwidth modulation, generation of multiple carrier frequencies without requiring inductors, pulling immunity, the ease of porting to new process technology nodes, and the like. Although DTCs are widely used, the DTCs have integral non-linearity (INL) and differential non-linearity (DNL) associated therewith, which creates distortion, spectral regrowth and spurs at an output of the DTC. Therefore, the DTC circuits need to be linearized in order to achieve the best performance and meet the strict demands of current and future communication standards.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
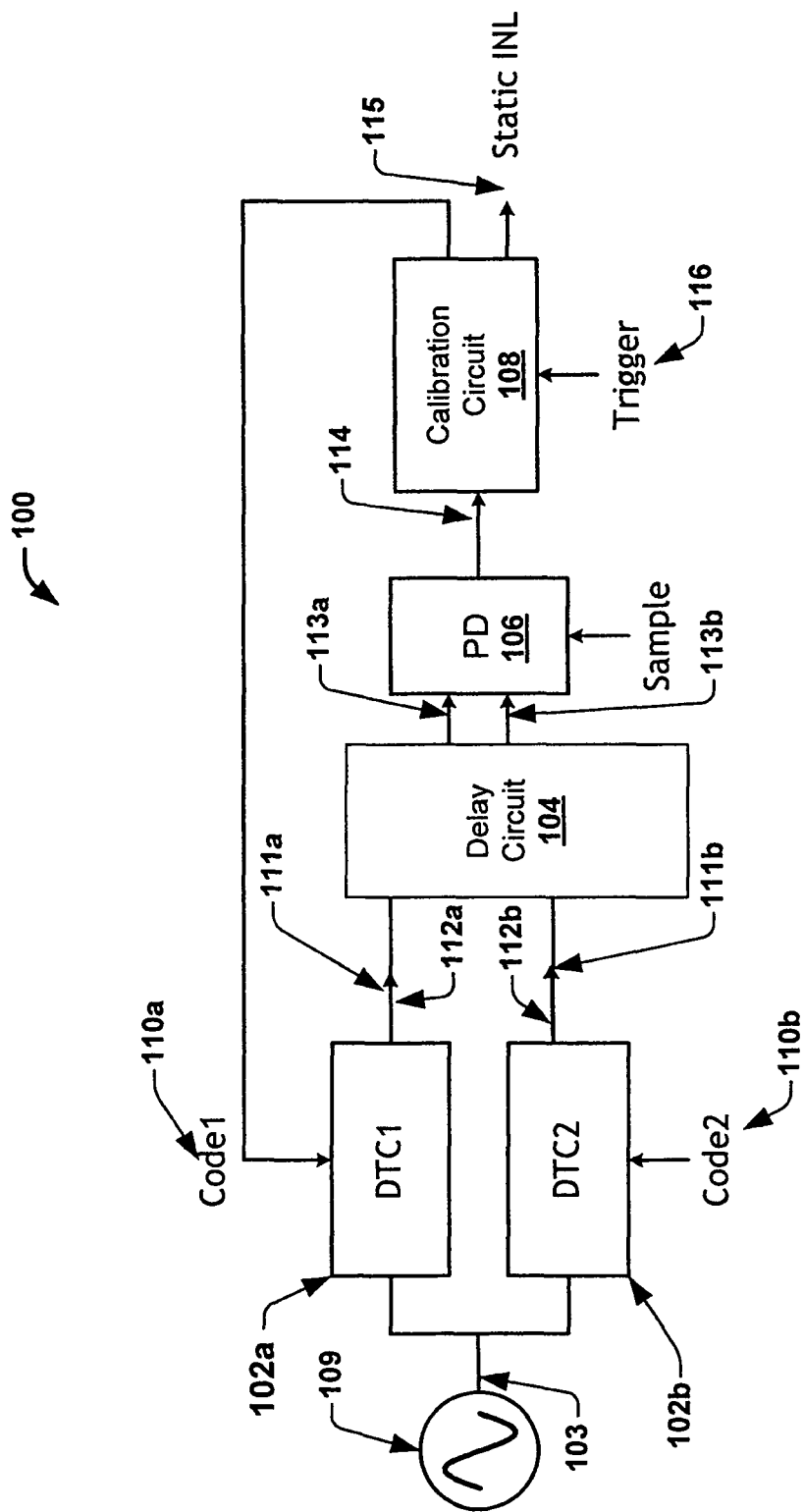
FIG. 1 depicts a block diagram of a system for calibrating digital to time converters (DTCs), according to one embodiment of the disclosure.

In one embodiment of the disclosure, a system for calibrating a digital to time converter (DTC) is disclosed. The system comprises a DTC circuit comprising a first DTC configured to receive a first digital input code and generate a first DTC output signal based on the first digital input code; and a second DTC configured to receive a second digital input code and generate a second DTC output signal based on the second digital input code, wherein the first DTC and the second DTC are synchronized with respect to one another via receipt of a same input clock signal. Further, the system comprises a delay circuit coupled to an output path of the first DTC and configured to apply a first delay to the first DTC output signal to generate a first delayed DTC output signal and a phase detector circuit configured to determine a phase difference between the first delayed DTC output signal and the second DTC output signal, thereby generating a phase detector output. In addition, the system comprises a calibration circuit configured to adjust the first digital input code of the first DTC to an adjusted first code that minimizes the phase detector output, wherein the adjusted first code has a predetermined relationship with the second input digital code.

In one embodiment of the disclosure, a method for calibrating a digital to time converter (DTC) is disclosed. The method comprises generating a first DTC output signal at an output of a first DTC based on a first digital input code and generating a second DTC output signal at an output of a second DTC based on a second digital input code, wherein the first DTC and the second DTC are coupled to one another. The method further comprises applying a first delay to the first DTC output signal using a delay circuit, to generate a first delayed DTC output signal and determining a phase difference between the first delayed DTC output signal and the second DTC output signal at a phase detector circuit, thereby generating a phase detector output. In addition, the method comprises adjusting the first digital input code of the first DTC to an adjusted first code that minimizes the phase detector output using a calibration circuit, wherein the adjusted first code has a predetermined relationship with the second input digital code.

In one embodiment of the disclosure, a system for calibrating a digital to time converter (DTC) is disclosed. The system comprises a DTC circuit comprising a first DTC and a second DTC coupled to one another and configured to alternately receive an incremented digital code at the first DTC and the second DTC, while keeping the other DTC at a constant code and generate a first output in response to the incremented digital code and generate a second output in response to a previous digital code that is not incremented. The system further comprises a time to digital converter (TDC) circuit coupled to the first DTC via a first connection and to the second DTC via a second connection, and configured to receive the first output based on the incremented digital code and the second output based on a previous digital code that has not been incremented; generate a first time difference of outputs of the first DTC and the second DTC corresponding to the incremented digital code; and generate a second time difference of outputs of the first DTC and the second DTC corresponding to the previous digital code. In addition, the system comprises a calibration circuit configured to determine a measurement associated with a non-linearity of the first DTC and the second DTC, based on the first and the second time differences; and configured to alternately provide the incremented digital code to the first DTC and the second DTC. In this embodiment, a TDC circuit is used to determine a time difference between the output edges of the first DTC and the second DTC. However, to give broader depth, a phase detector circuit which determines a phase difference or a time difference between the output edges of the first DTC and the second DTC to generate a time difference based thereon, is used instead of the TDC throughout the disclosure. In some embodiments, the phase detector circuit comprises similar elements as the TDC.

In one embodiment of the disclosure, a method for calibrating a digital to time converter (DTC) is disclosed. The method comprises alternately receiving an incremented digital code at a first DTC and a second DTC that are coupled to one another from a calibration circuit, while keeping the other DTC at a constant code and generating a first output in response to the incremented digital code and generating a second output in response to a previous digital code that is not incremented. The method further comprises receiving the first output based on the incremented digital code and the second output based on a previous digital code that has not been incremented at a TDC circuit and generating a first time difference of outputs of the first DTC and the second DTC corresponding to the incremented digital code and generating a second time difference of outputs of the first DTC and the second DTC corresponding to the previous digital code. In addition, the method comprises determining a measurement associated with a non-linearity of the first DTC and the second DTC, based on the first and the second time differences.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

As indicated above, DTC circuits need to be linearized in order to achieve the best performance and meet the strict demands of current and future communication standards. Without calibration, the non-linearity of the circuit is not good enough, and this limits the ability to achieve specifications for high demanding standards like 802.11 AC or 802.11AX. Previous calibration schemes for calibrating DTCs for INL and DNL are typically based on a complementary circuit of the DTC, that is, a time to digital converter (TDC). Since TDC are inherently non-linear in nature, one needs to calibrate the TDC first, in order to use the TDC to calibrate the DTC. The TDC can further introduce some errors into the DTC calibration. In addition, TDC being a large circuit takes up a large silicon area and has many digital interfaces, which makes this solution not favorable from a cost perspective. In some instances, the TDC resolution is worse compared to the DTC resolution, which leads to more calibration errors. In this disclosure, a method for DTC calibration, which uses the relative phase changes between 2 DTCs in order to learn the non-linearity curve of the DTC is proposed.

In particular, two calibration schemes for DTC that utilizes differential correlated double sampling on two DTCs is presented. In a first embodiment, a calibration scheme using two DTCs with a constant delay at the output of one of the DTCs is used. A code search algorithm is then implemented to equate the output phase of the two DTCs and calculate a code derivative (dcode/dt) at each section of the non-linearity curve. Integrating the result gives the complete non-linearity curve of the DTC. In a second embodiment, a calibration scheme using 2 DTCs (without any added delays) that are incremented alternately, one code at a time, in an overlapping manner is used. A very small TDC can capture the time difference between the DTC outputs is also provided. The difference of the time difference measurement (second order difference), gives the code to time value for each code, and will allow to calibrate both DTCs at the same time.

In some embodiments, the proposed calibration schemes allow for TDC elimination or extensive size reduction of the TDC, thereby saving TDC area, and calibration and digital supporting blocks. In some embodiments, the proposed calibration schemes for the DTC eliminate correlated noise, for example, flicker noise from DTC measurements, as all the measurements on the DTCs are performed differentially. Further, due to the differential measurement between the DTCs, any error associated with the DTC measurements are cancelled out. In some embodiments, comparing the phase between the DTCs can be done with a simple circuit, for example, a bang-bang phase detector, a stochastic TDC or a very short stochastic flash TDC that allows for low area utilization and low power consumption. The calibration schemes based on the relative phase changes between 2 DTCs further, in some embodiments, enables a system with more than one DTC to reuse the other DTC for DTC calibration without adding more calibration hardware.

FIG. 1 depicts a block diagram of a system 100 for calibrating digital to time converters (DTCs), according to one embodiment of the disclosure. The system comprises a DTC circuit 102, a delay circuit 104, a phase detector circuit 106 and a calibration circuit 108. The DTC circuit 102 comprises a first DTC 102a and a second DTC 102, which are fed with a same input clock signal 103 from a local oscillator 109. In some embodiments, the first DTC 102a comprises the DTC to be calibrated and the second DTC 102b comprises a reference DTC. In some embodiments, the first DTC 102a is configured to receive a first digital input code 110a and generate a first DTC output signal 111a in an output path 112a of the first DTC 102a, based on the first digital input code 110a. Further, in some embodiments, the second DTC 102b is configured to receive a second digital input code 110b and generate a second DTC output signal 111b in an output path 112b of the second DTC 102b, based on the second digital input code 110.

The delay circuit 104 is coupled to the DTC circuit 102 and is configured to provide a delay to the first DTC output signal 111a or the second DTC output signal 111b or both. In some embodiments, the delay circuit 104 can comprise a first delay circuit (not shown) in the output path 112a of the first DTC 102a configured to apply a first delay to the first DTC output signal 111a. Further, in some embodiments, the delay circuit 104 can comprise a second delay circuit (not shown) in the output path 112b of the second DTC 102b configured to apply a second delay to the second DTC output signal 111b. In some embodiments, the first delay applied to the first DTC output signal 111a and the second delay applied to the second DTC output signal 111b are the same.

In some embodiments, the delay circuit 104 further can comprise a first multiplexer circuit configured to selectively apply the first delay to the first DTC output signal 111a and a second multiplexer circuit configured to selectively apply the second delay to the second DTC output signal 111b. The phase detector circuit 106 is coupled to the delay circuit 104 and is configured to determine a phase difference between the first output signal 113a and the second output signal 113b of the delay circuit 104. In some embodiments, the first output signal 113a of the delay circuit 104 can comprise the first DTC output signal 111a or a delayed version of the first DTC output signal 111a. Similarly, in some embodiments, the second output signal 113b of the delay circuit 104 can comprise the second DTC output signal 111b or a delayed version of the second DTC output signal 111b.

The calibration circuit 108 is coupled to the phase detector circuit 106 and is configured to receive the phase detector output 114. In some embodiments, the calibration circuit 108 is configured to adjust the first digital input code 110a of the first DTC 102a to a value that minimizes the phase detector output 114 based on a search trigger 116. In some embodiments, the calibration circuit 108 can comprise a search algorithm that when triggered by giving a search trigger 116, adjusts the first digital input code 110a of the first DTC 102a to an adjusted code that equates a phase of the first output signal 113a of the delay circuit 104 to a phase of the second output signal 113b of the delay circuit 104. In some embodiments, a code difference between the adjusted code at the first DTC 102a and the reference code 110b at the second DTC 102b is determined at the calibration circuit 108. In some embodiments, the code difference corresponds to the output 115 in FIG. 1. In some embodiments, the code difference, gives a mapping of a time delay to a required code to be applied to the first DTC 102a. In some embodiments, the code difference is measured over a whole input code range of the reference DTC 102b by varying the reference code 110b over the whole allowable range. For example, upon minimizing the phase detector output 114 for a particular second input digital code 110b, the second digital input code 110b is incremented and the search algorithm within the calibration circuit 108 is triggered again. Repeating the code difference measurement over the whole input code range of the reference DTC, allows to trace the non-linearity of the first DTC 102a.

In some embodiments, a table of data or histogram can be generated based on the code difference measurements along the entire code range, to provide a distortion or pre-distortion mapping table for correcting the nonlinearity. In some embodiments, the system 100 can be configured for measuring and tracking the DTC non-linearity without interrupting the normal operations of the first DTC 102a. In one aspect, DTC non-linearity (e.g., static or dynamic non-linearity) can be measured or traced during a power-on sequence. Alternately or additionally, the DTC non-linearity can be traced as the first DTC 102a operates in active transmission. In some embodiments, tracing the non-linearity or the calibration of the first DTC 102a can be initiated (by applying a search trigger 115 to the search algorithm within the calibration circuit 108) based on some predetermined operating conditions, for example, a temperature of the system exceeding a predetermined threshold. In some embodiments, the predetermined operating conditions are monitored within the calibration circuit. Alternately, in other embodiments, the predetermined operating conditions are monitored using an external controller.

Figure 2:
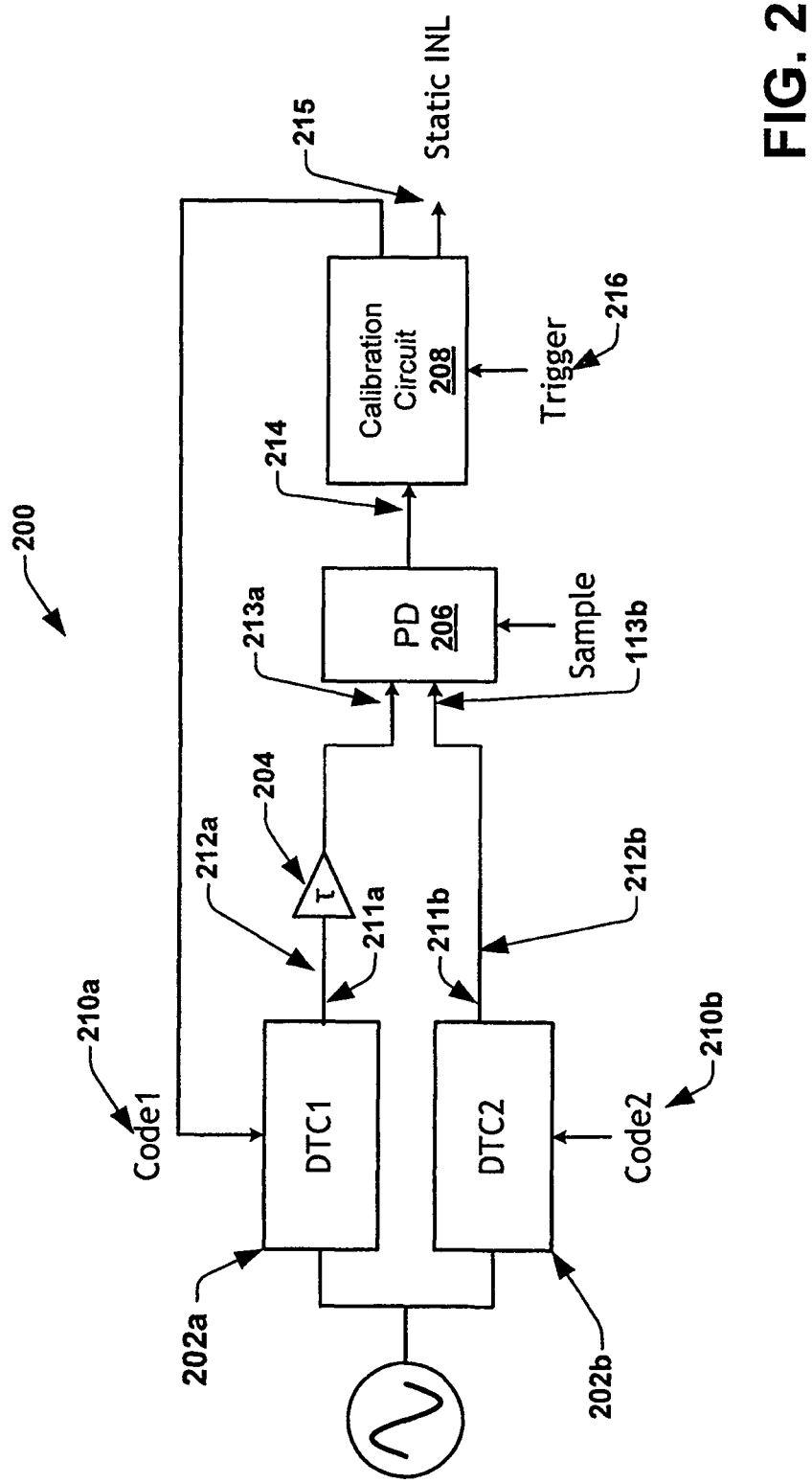
FIG. 2 depicts an example implementation of a system for calibrating digital to time converters (DTCs), according to one embodiment of the disclosure.

FIG. 2 depicts an example implementation of a system 200 for calibrating digital to time converters (DTCs), according to one embodiment of the disclosure. The system 200 is similar to the system 100 in FIG. 1, with the delay circuit 104 replaced by a delay circuit 204 in an output path of the first DTC 202. The system 200 comprises a first DTC circuit 202a, a second DTC circuit 202b, a delay circuit 204, a phase detector circuit 206 and a calibration circuit 208. In some embodiments, the first DTC 202a is configured to receive a first digital input code 210a and generate a first DTC output signal 212a in an output path 211a of the first DTC 202a, based on the first digital input code 210a. Further, in some embodiments, the second DTC 202b is configured to receive a second digital input code 210b and generate a second DTC output signal 212b in an output path 211b of the second DTC 202b, based on the second digital input code 210b. In some embodiments, the first DTC circuit 202a comprises the DTC to be calibrated and the second DTC circuit 202b comprises a reference DTC. In some embodiments, the first DTC circuit 202a and the second DTC circuit 202b are identical.

The delay circuit 204 is coupled to an output path 211a of the first DTC circuit 202a and is configured to provide a delay, for example, τ to a first DTC output signal 212a, thereby generating a first delayed DTC output signal 213a at an output of the delay circuit 204. The phase detector 206 is configured to determine a phase difference between the first delayed DTC output signal 213a and a second DTC output signal 212b, thereby generating a phase detector output 214. In order to calibrate the first DTC circuit 202a, in some embodiments, a reference code 210b, for example, code 2 in FIG. 2, is given to the reference DTC, for example, the second DTC circuit 202b. To begin with, in some embodiments, the first digital input code 210a can be same as the reference code 210b. For a given reference code at the second DTC circuit 202b, a search algorithm within the calibration circuit 208 adjusts the first digital input code 210a given to the first DTC circuit 202a to a value that when given to the first DTC circuit 202a will equate the phase of the output clock from the reference DTC 202b to the phase of the first DTC circuit 202a+delay τ. In some embodiments, the search algorithm within the calibration circuit 208 adjusts the first digital input code 210a to an adjusted first code that minimizes the phase detector output 214, for example, phase detector output is driven to zero. In some embodiments, the search algorithm is configured to adjust the first digital input code 210a, upon receiving a search trigger 216 at the calibration circuit 208. In some embodiments, a difference between the adjusted first code and the reference code, Δcode is indicative of a non-linearity of the first DTC circuit 202a for the given reference code 210b. In some embodiments, the calibration circuit 208 is further configured to determine the Δcode. In some embodiments, Δcode corresponds to the output 215 in FIG. 2.

In some embodiments, if the code-delay transfer function of the DTCs (assuming identical DTCs) is given by the function, f(code), then the objective of the calibration is to construct $f^{-1}(t)$, the inverse mapping table. In some embodiments, constructing the inverse mapping table corresponds determining the Δcode. In some embodiments, the phase detector output 214 is driven to 0 when the output edges of the first delayed DTC output signal 213a and the second DTC output signal 212b (t1 and t2) are aligned in time. In such instances, the following equation is satisfied:

$$f^{-1}(t_1) - f^{-1}(t_2) = code_2 - code_1 \quad (1)$$

$$f^{-1}(t_1) - f^{-1}(t_1 - \tau) = \Delta code \quad (2)$$

$$\tau \cdot \left.\frac{\partial f^{-1}(t)}{\partial t}\right|_{t=t_1} \approx \Delta code \quad (3)$$

The code difference between the 2 DTCs (Δcode) gives the slope of the inverse transfer function, i.e. the slope of the function mapping of time delay to the required code on the DTC, for example, the first DTC circuit 202a. In some embodiments, for a reference code 210b given to the second DTC circuit 202b, a first digital input code equal to the reference code 210b+Δcode, when applied to the first DTC circuit 202a aligns the phases of the two DTCs. In other embodiments, Δcode corresponds to a code difference that when applied to the reference code 210b, gives a time delta of τ between the 2 DTCs. Repeating the same measurement for each and every input code at the reference DTC 202b, one can trace the code delta that gives a delay of τ along the DTC non-linearity. In some embodiments, tracing the Δcode along the DTC non-linearity corresponds to determining a Δcode that gives a constant delay across the different sections of the non-linearity curve of the DTC.

Figure 3A:
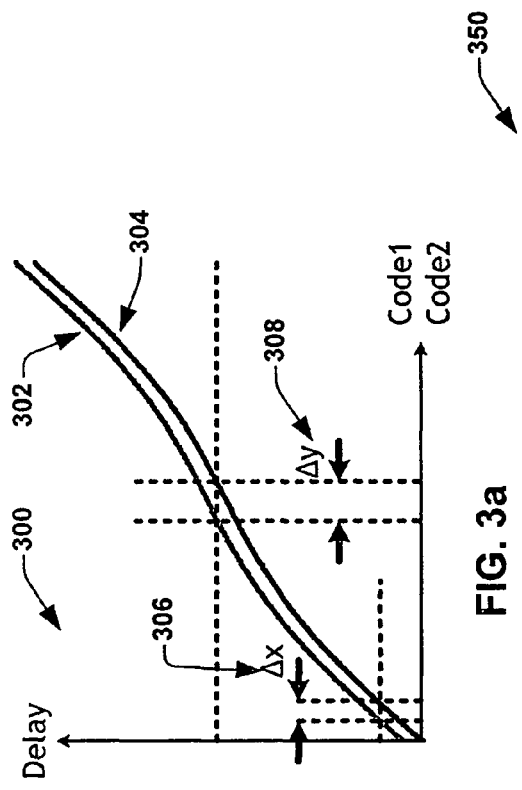
FIG. 3a shows a non-linearity curve of the first DTC circuit and the non-linearity curve of the second DTC circuit having a time delta of τ between the two DTCs, according to one embodiment of the disclosure.

FIG. 3a shows a non-linearity curve 302 of the first DTC circuit 202a and the non-linearity curve 304 of the second DTC circuit 202b having a time delta of τ between the two DTCs, according to one embodiment of the disclosure. Δx 306 and Δy 308 represents the Δcode that gives a time delta of τ between the 2 DTCs, at 2 different points of measurements. It can be seen from FIG. 2 that Δcode (i.e., Δx 306 and Δy 308) is directly related to the slope of the inverse non-linearity curve at the point of measurement. That is, due to the non-linearity of the DTCs, Δcode varies along the non-linearity curve of the DTCs, for example, Δx 306 is different from Δy 308. As indicated above, the objective of the calibration is to determine the Δcode for various points of measurement along the DTC non-linearity curve.

Figure 3B:
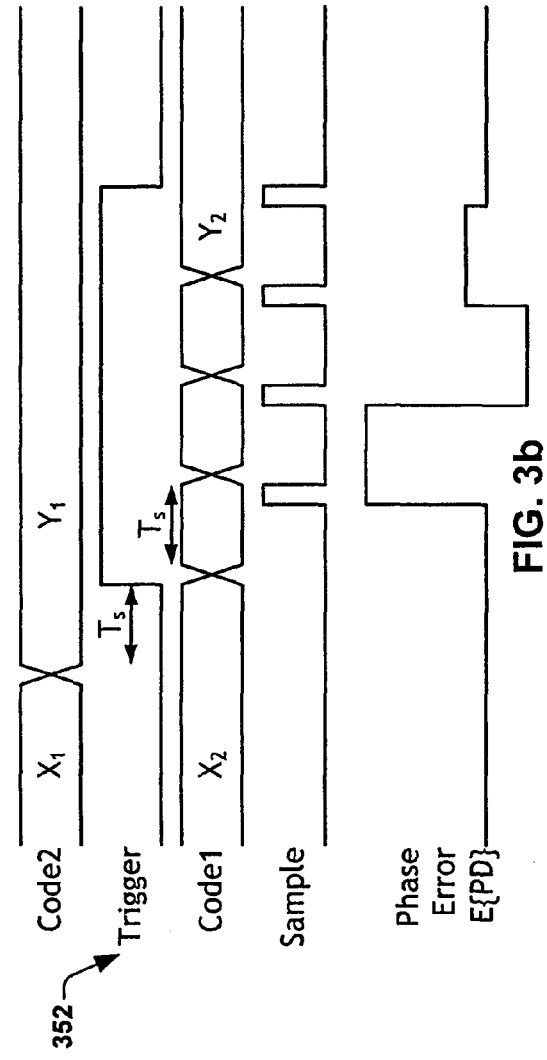
FIG. 3b depicts a timing diagram for the search and averaging algorithm of the system in FIG. 2, according to one embodiment of the disclosure.

FIG. 3b depicts a timing diagram 300 for the search and averaging algorithm of the system 200 in FIG. 2, according to one embodiment of the disclosure. Code 2 represents the reference code 210b of FIG. 2 and code 1 represents the first digital input code 210a of FIG. 2. In one embodiment, the reference code, code 2 is first changed to Y1 and the system is given a search trigger 352. In response, the search algorithm searches for a code 1 to be applied to the feedback DTC (i.e., first DTC circuit 202a in FIG. 2) before it converges the feedback DTC code, that is, code 1 converges to Y2. Here Y1-Y2 corresponds to the Δcode, which is the measurement result.

Figure 4:
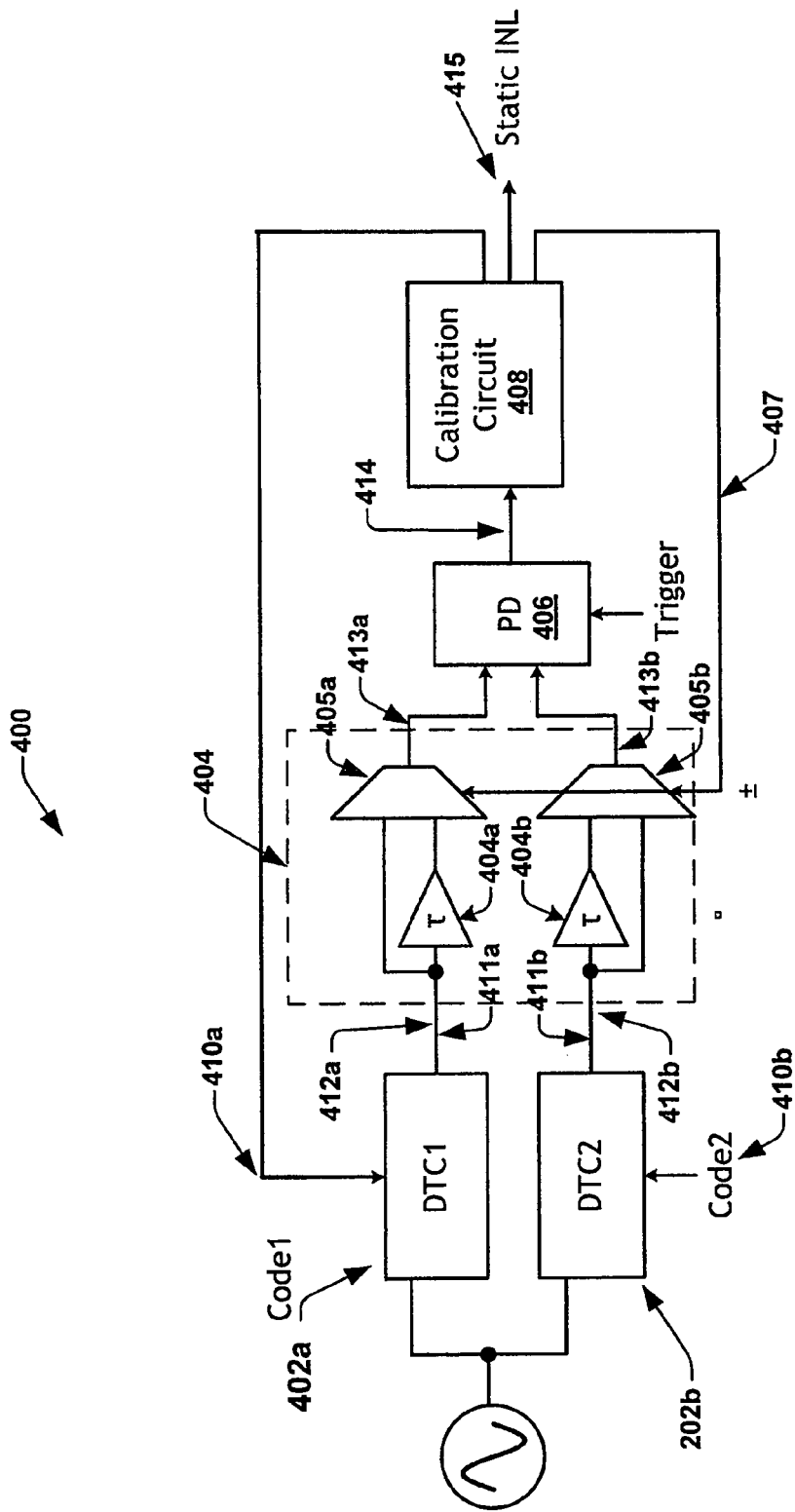
FIG. 4 depicts an example implementation of a system for calibrating digital to time converters (DTCs), according to one embodiment of the disclosure.

FIG. 4 depicts an example implementation of a system 400 for calibrating digital to time converters (DTCs), according to one embodiment of the disclosure. The calibration scheme in system 400 is a variant of the calibration scheme in scheme 200. In system 200, in some embodiments, due to the added delay to one DTC, an area at the end of the non-linearity curves cannot be measured. Further, errors due to the differences in the two DTCs occur in system 200. To overcome the limitations of the system 200, the system 400 for calibrating DTCs is proposed. The system 400 is similar to the system 200 in FIG. 2, with the delay circuit 204 replaced by a delay circuit 404 configured to selectively apply a delay of τ in an output path of the first DTC circuit 402a and the second DTC circuit 402b. The system 400 comprises a first DTC circuit 402a, a second DTC circuit 402b, a delay circuit 404, a phase detector circuit 406 and a calibration circuit 408.

In some embodiments, the first DTC circuit 402a is configured to receive a first digital input code 410a and generate a first DTC output signal 412a in an output path 411a of the first DTC circuit 402a, based on the first digital input code 410a. Further, in some embodiments, the second DTC circuit 402b is configured to receive a second digital input code 410b and generate a second DTC output signal 412b in an output path 411b of the second DTC 402b, based on the second digital input code 410b. In some embodiments, the first DTC circuit 402a comprises the DTC to be calibrated and the second DTC circuit 402b comprises a reference DTC.

The delay circuit 404 comprises a first delay circuit 404a in the output path 411a of the first DTC circuit 402a and a second delay circuit 404b in the output path of the second DTC circuit 402b. The delay circuit 404 further comprises a first multiplexer circuit 405a configured to selectively apply or bypass the first delay circuit 404a from the output path 411a of the first DTC circuit 402a, based on a control signal 407 from the calibration circuit 408. In addition, the delay circuit 404 further comprises a second multiplexer circuit 405b configured to selectively apply or bypass the second delay circuit 404b from the output path 411b of the second DTC circuit 402b, based on a control signal 407 from the calibration circuit 408. The multiplexer circuits 405a and 405b along with the control signal 407 from the calibration circuit 408, enables the system 400 to operate in a first mode, a second mode, a third mode and a fourth mode, as given in greater detail below.

The phase detector 406 is configured to determine a phase difference between an output signal 413a of the first multiplexer circuit 405a and an output signal 413b of the second multiplexer circuit 405b, thereby generating a phase detector output 414. The calibration circuit 408 is coupled to the phase detector circuit 406 and is configured to adjust the first digital input code 410a of the first DTC circuit 402a that minimizes the phase detector output 414. In some embodiments, the calibration circuit 408 is further configured to generate the control signal 407 configured to operate the system 400 in the first mode, the second mode, the third mode or the fourth mode.

In order to eliminate the error that rise due to the differences between the first DTC circuit 402a and the second DTC circuit 402b in system 400, in some embodiments, Δcode for a given reference code 410b is measured on the same DTC, for example, the first DTC circuit 402a, once with added delay and once without. In such embodiments, the search algorithm within the calibration circuit 408 is run twice per reference code 410b, for example, once with a delay τ in the output path 411a of the first DTC circuit 402a and once without the delay τ in the output path 411a of the first DTC circuit 402a. To enable this functionality, in some embodiments, the system 400 is configured to operate in a first mode and a second mode, for each reference code 410b applied to the second DTC circuit 402b. In some embodiments, in a first mode, a delay of τ is applied to the output path 411a of the first DTC circuit 402a and no delay applied to the output path 411b of the second DTC circuit 402b. Further, in a second mode, no delay applied to the output path 411a of the first DTC circuit 402a and no delay applied to the output path 411b of the second DTC circuit 402b.

If the first DTC circuit 402a has a transfer function given by f(code) and the second DTC circuit 402b has a transfer function given by g(code), then a first Δcode corresponding to the first mode is given by, $$g^{-1}(t_1)-f^{-1}(t_1-\tau)=code_2-code_{1a} \quad (4)$$

Further, a second Δcode corresponding to the second mode is given by, $$g^{-1}(t_1)-f^{-1}(t_1-0)=code_2-code_{1b} \quad (5)$$

Subtracting (5) from (4), we get a final Δcode, $$f^{-1}(t_1-0)-f^{-1}(t_1-\tau)=code_{1b}-code_{1a}=\Delta code \quad (6)$$

$$\tau \cdot \frac{\partial f^{-1}(t)}{\partial t}\bigg|_{t=t_1} = \Delta code \quad (7)$$

Where code 2 is the reference code 410b, code 1a is the adjusted first code of the first DTC circuit 402a, when a delay τ is included in the output path of the first DTC circuit 402a (i.e., in a first mode) and code 1b is the adjusted first code of the first DTC circuit 402a, when a delay τ is not included in the output path of the first DTC circuit 402a (i.e., in a second mode). Further, the final Δcode gives the slope of the inverse transfer function, as indicated above with respect to FIG. 2.

In some embodiments, the final code, Δcode corresponds to the code difference needed to delay the output of the first DTC circuit 402a by a value of τ, around the corresponding reference code, code 2. In some embodiments, Δcode is the calibration output that is indicative of the non-linearity of the first DTC circuit 402a for a given reference code 410b at the second DTC circuit 402b. In some embodiments, the calibration circuit 408 is further configured to determine the final Δcode. In some embodiments, the final Δcode corresponds to the output 415 in FIG. 4. Further, as can be seen from the equation (6) above, the final Δcode is determined by taking a difference of the two time error measurements (given in equations (4) and (5)) on the same DTCs. Therefore, in such embodiments, any correlated errors, for example, mismatch, slow supply, temperature variations, flicker noise etc., will be common to both the time error measurements given in equations (4) and (5) and will be suppressed by the difference operation in the equation (6), similar to correlated double sampling.

Figure 5:
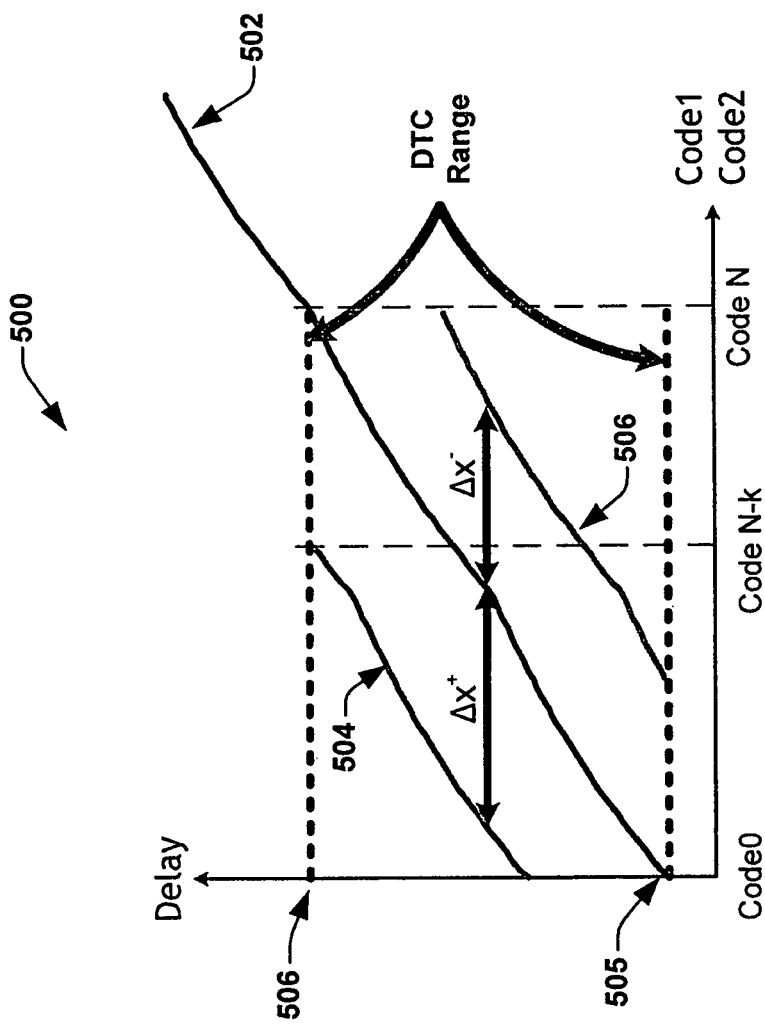
FIG. 5 shows a graph that illustrates the curve-end problem in the calibration of DTC converters in the system of FIG. 4, according to one embodiment of the disclosure.

Further, as indicated above, if delay is added to only one of the DTCs, for example, the first DTC circuit 402a, to determine the final Δcode, then in some embodiments, an area at the end of the non-linearity curves cannot be measured. FIG. 5 shows a graph 500 that illustrates the curve-end problem in the calibration of DTC converters. FIG. 5 is explained herein with reference to FIG. 4. In FIG. 5, the curve 502 represents the non-linearity curve of the reference DTC 402b and the line 506 represents the maximum allowable delay range for the first DTC circuit 402a and the second DTC circuit 402b. In one instance, when a delay of τ is added only to the output path 411a of the first DTC circuit 402a, the non-linearity curve of the first DTC circuit 402a is given by the curve 504 (based on the operation of the system 400 in the first mode and the second mode). As can be seen from FIG. 5, as the reference code, for example, code 2 in FIG. 4 is increased from code 0 to code N, a measurement of Δcode can only be performed for the code range code 0 to code N−K, as the delay of the first DTC circuit 402a reached the maximum allowable delay at code N−K. Therefore, in such embodiments, a measurement of the Δcode for the reference code range code N−K to code N cannot be performed.

In order to measure the Δcode for the reference code range code N−K to code N, an additional delay τ is added to the output path 411b of the second DTC circuit 402b. In such instances, the non-linearity curve of the first DTC circuit 402a is given by the curve 506. As can be seen from FIG. 5, for each reference code, code N−k to code N, the delay of the first DTC circuit 402a is lower than the delay of the second DTC circuit 402b (i.e., the reference DTC) giving a delay of maximum allowable delay 506-τ for code N. This allows for the measurement of the Δcode for the code range code N−K to code N.

To enable this functionality, in some embodiments, the system 400 is configured to operate in a third mode, with a delay of τ applied to the output path 411a of the first DTC circuit 402a and the output path 411b of the second DTC circuit 402b. Further, the system 400 is configured to operate in a fourth mode, with no delay applied to the output path 411a of the first DTC circuit 402a and a delay of τ applied to the output path 411b of the second DTC circuit 402b. In some embodiments, a calibration of the first DTC circuit 402a over the entire code range of the first DTC circuit 402a can be achieved by operating the system 400 in the first mode and the second mode, and obtaining a final Δcode according to equation (6) above, for a plurality of reference codes within a first code range of the entire reference code range. In some embodiments, first code range corresponds to the reference code range, code0 to code N−K in FIG. 5.

At code N−K, the delay in the first DTC circuit 402a reaches the maximum allowable delay range, for example, 506 in FIG. 5 and therefore calibration measurements for the remaining codes in the reference code range cannot be determined. Therefore, in such instances, in order to obtain the calibration measurements for the missing code range of the second DTC circuit 402b, for example, code N−K to code N in FIG. 5, the system 400 is operated in the third mode and the fourth mode, and a final Δcode according to equation (6) is obtained for each of the reference code in a second code range within the entire reference code range. In some embodiments, the second code range corresponds to the reference code range, code N−K to code N in FIG. 5.

In some embodiments, the calibration circuit 408 is further configured to switch the operation of the system 400 from the first mode and the second mode in the first code range, to the third mode and the fourth mode in the second code range, when a delay at the output of the first DTC circuit 402a reaches or exceeds a predetermined threshold. In some embodiments, the predetermined threshold comprises the maximum allowable delay range of the first DTC circuit 402a.

Figure 6:
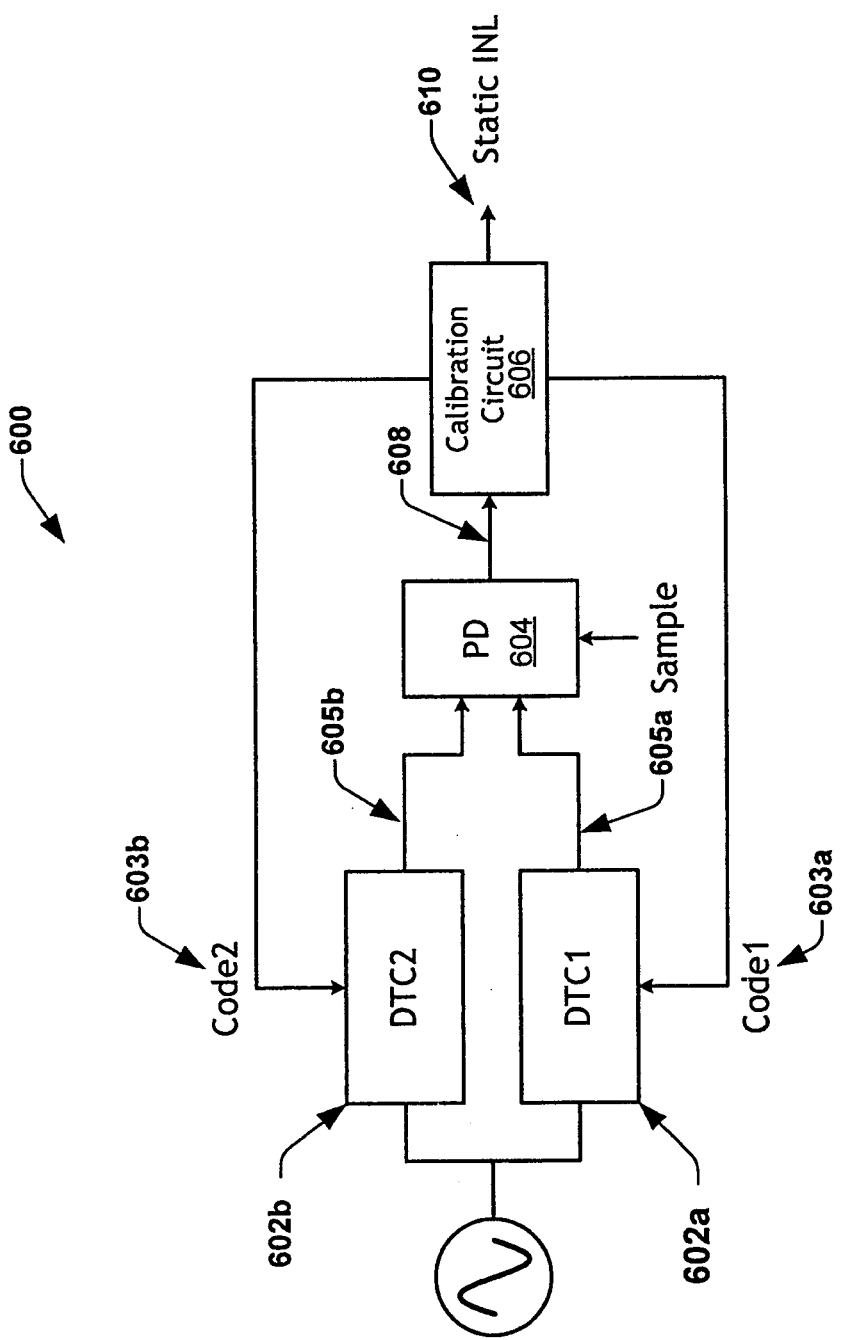
FIG. 6 depicts a block diagram of a system for calibrating digital to time converters (DTCs), according to one embodiment of the disclosure.

FIG. 6 depicts a block diagram of a system 600 for calibrating digital to time converters (DTCs), according to one embodiment of the disclosure. The system 600 comprises a first DTC circuit 602a, a second DTC circuit 602b, a phase detector circuit 604 and a calibration circuit 606. The first DTC circuit 602a is configured to receive a first code 603a and generate a first DTC output signal 605a, and the second DTC circuit 602b is configured to receive a second code 603b and generate a second DTC output signal 605b. In some embodiments, the first DTC circuit 602a and the second DTC circuit 602b are coupled to one another. To measure the dynamic behaviour and then calibrate the DTC (e.g., DTC 602a and 602b), the DTC static integral non-linearity (INL) is measured. In order to measure the DTC non-linearity, in some embodiments, the first DTC circuit 602a and the second DTC circuit 602b are configured to alternately receive an incremented digital code, while keeping the other DTC at a constant code. In some embodiments, the system 600 can calibrate both the first DTC circuit 602a and the second DTC circuit 602b.

The phase detector circuit 604 is coupled to the first DTC circuit 602a and the second DTC circuit 602b and is configured to measure a plurality of time differences of the outputs of the first DTC circuit 602a and the second DTC circuit 602b indicative of the DTC non-linearity, based on receiving the sampling pulses 607. In some embodiments, the phase detector circuit 604 comprises a time to digital converter (TDC). The calibration circuit 606 is coupled to the phase detector circuit 604 and is configured to increment the first code 603a of the first DTC circuit 602a and the second code 603b of the second DTC circuit 602b independently at a time. In some embodiments, the code transitions are applied to the two DTCs 602a and 602b, each time allowing one DTC (e.g., DTC 602a) to settle before applying the incremented code to the other DTC (e.g., DTC 602b). In some embodiments, the calibration circuit 606 is further configured to select the codes applied to the DTCs 602a and 602b in a way that ensures that the DTC outputs (605a and 605b) are close enough to be within the dynamic range of the phase detector circuit 604. In some embodiments, the codes applied to the 2 DTCs 602a and 602b are selected at the calibration circuit 606 based on the static INL measurements 610 determined within the calibration circuit 606. In some embodiments, the calibration circuit 606 comprises a calibration finite state machine (FSM).

In one example embodiment, the system 600 is operable to measure static INL or dynamic non-linearity based on open loop correlated double sampling. The two DTCs 602a and 602b can be controlled by the calibration finite state machine (FSM) 606, which increments each DTC 602a, 602b independently at a time. For example, for determining static INL, initially $DTC_1$ is given a code $X_0$ and $DTC_2$ is given code $Y_0$. For example, assuming again that the DTCs 602a and 602b are given by the transfer functions g(•) and f(•) respectively, then the phase detector 604 (e.g., a TDC) measures a time difference at the output given by $$\tau_{00} = g(X_0) - f(Y_0) \qquad (8)$$

In some embodiments, $\tau_{00}$ corresponds to the output 608 of the phase detector circuit 604 in FIG. 6. Now, calibration FSM 606 increments $DTC_2$ to code $Y_1$ (e.g., $Y_1 = Y_0 + 1$). The TDC 604 measures a time difference associated with the incremented code $Y_1$ given by:

$$\tau_{01} = g(X_0) - f(Y_1) \qquad (9)$$

Then, the system 400 increments $DTC_1$ to code $X_1$ (e.g., $X_1 = X_0 + 1$). The new measurement is given by:

$$\tau_{11} = g(X_1) - f(Y_1) \qquad (10)$$

If the differences of the measurements are observed, it can be seen that the magnitude of the delay step is extracted around the codes $X_0$ and $Y_0$, which is indicative of the static non-linearity of the DTC. For example, a difference between equation (8) and (9) gives, $$\tau_{00} - \tau_{01} = f(Y_1) - f(Y_0) \qquad (11)$$

In some embodiments, $\tau_{00} - \tau_{01}$ gives a time Δ or a time delay associated with a code increment $Y_1$ from the previous code $Y_0$ for the second DTC circuit 602b. Similarly, a difference between equation (9) and (10) gives, $$\tau_{11} - \tau_{01} = g(X_1) - g(X_0) \qquad (12)$$

In some embodiments. $\tau_{11} - \tau_{01}$ gives a time Δ or a time delay associated with a code increment $X_1$ from the previous code $X_0$ for the first DTC circuit 602a.

In some embodiments, the measurements $\tau_{00} - \tau_{01}$ and $\tau_{11} - \tau_{01}$ are determined by a difference operation of the time differences at the output of the phase detector circuit 604, within the calibration circuit 606. In some embodiments, the measurements $\tau_{00} - \tau_{01}$ and $\tau_{11} - \tau_{01}$ corresponds to the output 610 of the calibration circuit 606 if FIG. 6. In some embodiments, the calibration circuit 606 is further configured to repeat the sequence of alternately incrementing the two different DTCs 602a and 602b to cover the entire code range of the first DTC circuit 602a and the second DTC circuit 602b. Consequently, the non-linearity (e.g., the static non-linearity, or static INL) of the first DTC circuit 602a and 602b can be accurately measured by the averaging the measurements determined over the whole code range of the first DTC circuit 602a and the second DTC circuit 602b, respectively.

In some embodiments, since the measurements $\tau_{00}-\tau_{01}$ and $\tau_{11}-\tau_{01}$ are based on a difference between two time error measurements of the same DTCs, any correlated noise sources such as flicker noise, offsets, drifts from PVT changes, etc., will be suppressed or high-pass filtered in the system 600, similar to correlated double sampling. For example, in one embodiment, a noise n(t) is assumed to be associated with a time difference measurement at the output of the phase detector circuit, for example, PD 604 in FIG. 6. In some embodiments, the noise n(t) comprises a correlated component, $n_c(t)$, and an uncorrelated component, $n_u(t)$. The following equations describe the correlated double sampling in the system 600. At time t, the time error measurement at the output of the phase detector circuit 604 is given by, $$\tau_{XY}(t)=g(X(t))-f(Y(t))+n_c(t)+n_u(t) \quad (12)$$

At time t+Δt, the time error measurement at the output of the phase detector circuit 604 is given by, $$\tau_{XY}(t+\Delta t)=g(X(t+\Delta t))-f(Y(t+\Delta t))+n_c(t+\Delta t)+n_u(t+\Delta t) \quad (13)$$

During this time transition, if it is assumed that the code Y is kept constant, i.e., Y(t+Δt)=Y(t), then, a measurement associated with a difference of the two time error measurements is given by:

$$\tau_{XY}(t+\Delta t)-\tau_{XY}(t)=g(X(t+\Delta t))-g(X(t))+n_c(t+\Delta t)-n_c(t)+n_u(t+\Delta t)-n_u(t) \quad (14)$$

The term g(X(t+Δt))−g(X(t)) is the desired measurement. If Δt is small, the correlated noise $n_c(t+\Delta t)$ will be same as the correlated noise $n_c(t)$. Therefore, the correlated noise is high pass filtered or suppressed as can be seen from the term $n_c(t+\Delta t)-n_c(t)$. By high-pass filtering, it is intended to mean that only fast changing noise signals are high-pass filtered or not cancelled during the measurement. The uncorrelated noise is increased by 3 dB but can be suppressed by averaging.

The system 600 determines the transfer functions of the two DTCs separately. For example if $DTC_1$ has a transfer function of g(x), i.e. the outputs edge of the $DTC_1$ is delayed from the input edge as a function of the applied digital code as g(code). Similarly if we assume that $DTC_2$ is described by the transfer function f(x), the outputs edge of the $DTC_2$ is delayed from the input edge as a function of the applied digital code as f(code). In response to incrementing the digital codes alternatingly and one at a time, the magnitudes of the delay step for each DTC, DTC1 602a and DTC2 602b are extracted. In some embodiments, this enables the system 600 to determine and apply the particular digital code on one DTC and predict what to apply on the other DTC to have the two edges aligned.

Figure 7:
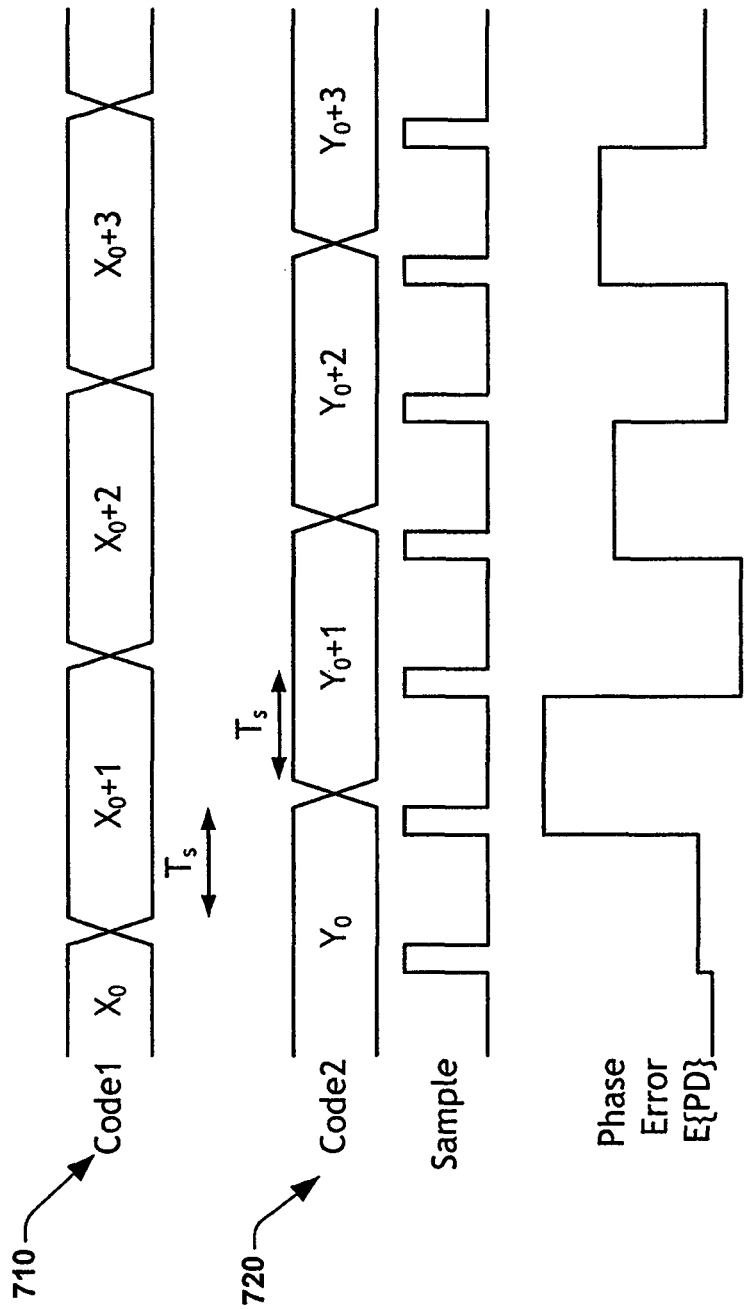
FIG. 7 illustrates the control and timing sequence diagrams of the system for calibrating digital to time converters (DTCs) in FIG. 6, according to one embodiment of the disclosure.

FIG. 7 illustrates the control and timing sequence diagrams 700 of the system 600, according to one embodiment of the disclosure. The timing diagram 710 is the code given to the DTC1 in FIG. 6 and the time diagram 720 is the code given to the DTC2 in FIG. 6. As can be seen, code transitions are applied to the two DTCs 602a and 602b, each time allowing one DTC (e.g., DTC 602a) to settle before applying the incremented code to the other DTC (e.g., DTC 602b), for example, after a time interval of Ts.

Figure 8:
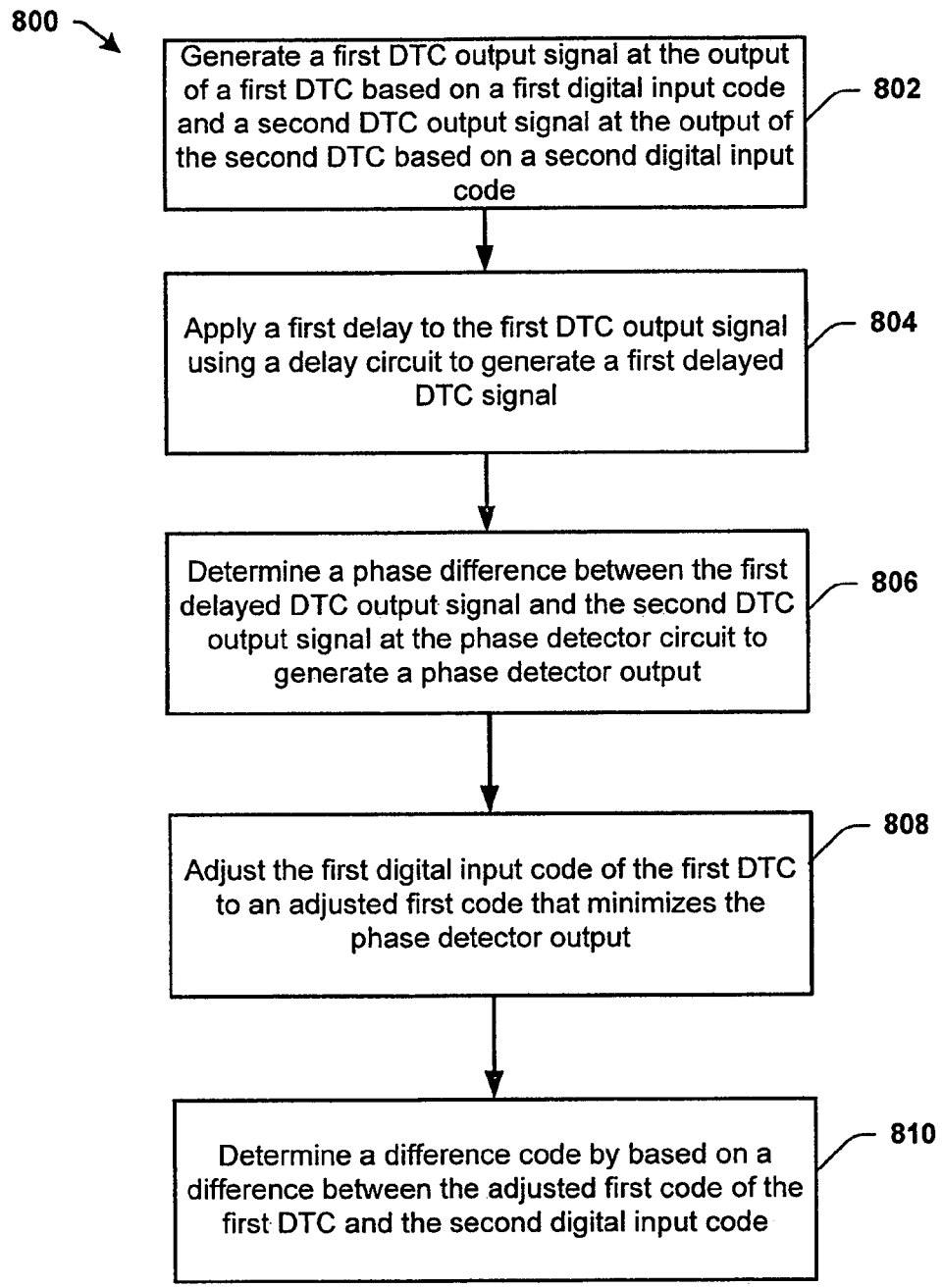
FIG. 8 illustrates a flow chart for a method for calibrating digital to time converters, according to one embodiment of the disclosure.

FIG. 8 illustrates a flow chart for a method 800 for calibrating digital to time converters, according to one embodiment of the disclosure. The method 800 is described herein with reference to the system 400 in FIG. 4. At 802, a first DTC output signal is generated at the output of a first DTC (e.g., DTC 402a) based on a first digital input code and a second DTC output signal is generated at the output of the second DTC (e.g., DTC 402b) based on a second digital input code. At 804, a first delay is applied to the first DTC output signal using a delay circuit (e.g., delay 404a) to generate a first delayed DTC signal. In one embodiment, the method can include selectively applying the first delay to the output path of the first DTC (e.g., DTC 402a) in a first mode and a third mode, and selectively bypassing the first delay at the output path of the first DTC (e.g., DTC 402a) in a second mode and a fourth mode. Alternately or additionally, the method can include selectively bypassing a second delay at the output path of the second DTC in the first mode and the second mode, and selectively applying the second delay to the output path of the second DTC in the third mode and the fourth mode.

At 806, a phase difference between the first delayed DTC output signal and the second DTC output signal is determined at the phase detector circuit (e.g., 406), thereby generating a phase detector output (e.g., 414). At 808, the first digital input code of the first DTC is adjusted to an adjusted first code that minimizes the phase detector output using a calibration circuit (e.g., 408). In one embodiment, the method can include determining a first adjusted code for the first mode and the second mode, for a plurality of the second digital input codes in a first code range of an allowable code range of the second DTC and determining a first adjusted code for the third mode and the fourth mode, for a plurality of the second digital input codes in a second, different code range of an allowable code range of the second DTC.

At 810, a difference code is formed by determining a difference between the adjusted first code of the first DTC and the second digital input code at the calibration circuit, which is a measurement indicative of the non-linearity of the first DTC. In some embodiments, the method can further include determining the difference code for a plurality of second digital codes to generate a plurality of difference codes to cover a whole spectrum of the first DTC. Alternatively, in other embodiments, a first code difference between a first adjusted code at the first DTC in the first mode and a first adjusted code at the first DTC in the second mode is determined to generate a first calibration output for the first DTC, for a plurality of the second digital input codes in a first code range of an allowable code range of the second DTC. Additionally, a second code difference between a first adjusted code at the first DTC in the third mode and a first adjusted code at the first DTC in the fourth mode is determined to generate a second calibration output for the first DTC, for a plurality of the second digital input codes in a second, different code range of an allowable code range of the second DTC. In some embodiments, the first calibration output for the first code range and the second calibration result for the second code range, together trace the non-linearity of the first DTC.

Figure 9:
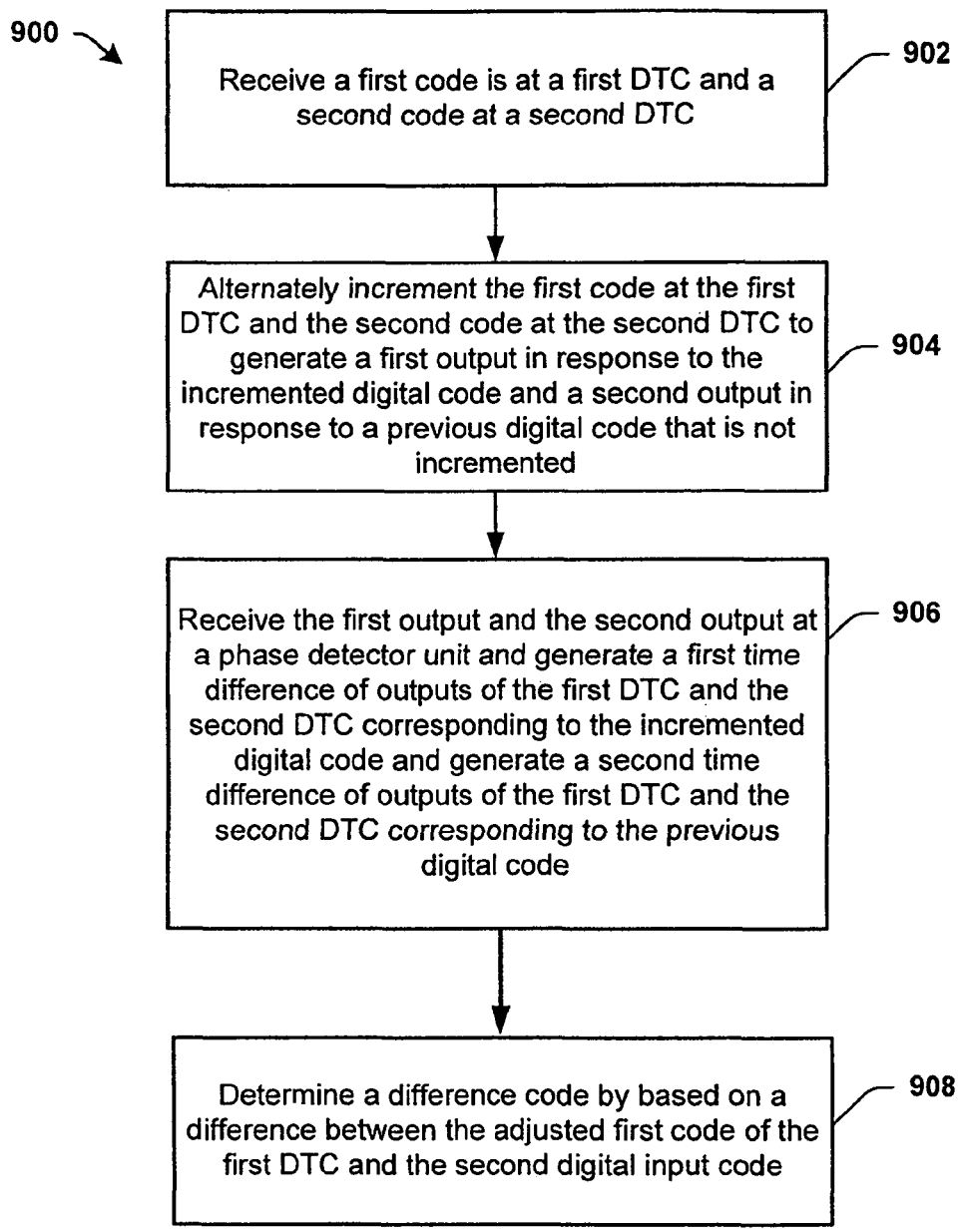
FIG. 9 illustrates a flow chart for a method for calibrating digital to time converters, according to one embodiment of the disclosure.

FIG. 9 illustrates a flow chart for a method 900 for calibrating digital to time converters, according to one embodiment of the disclosure. The method 900 is described herein with reference to the system 600 in FIG. 6. At 902, a first code is received at a first DTC and a second code is received at a second DTC. At 904, the first code at the first DTC and the second code at the second DTC are incremented alternately to generate a first output in response to the incremented digital code and a second output in response to a previous digital code that is not incremented. For example, for the second DTC 602b in FIG. 6, the first output corresponds to $f(Y_1)$ in equation (9) and the second output corresponds to $f(Y_0)$ in equation (8). In some embodiments, the second output is generated before the first output. In some embodiments, the method includes generating the first output and the second output for both the first DTC 602a and the second DTC 602b. In some embodiments, the method further includes receiving the incremented digital code at the first DTC and the second DTC from the calibration circuit, in a plurality of cycles, to cover the whole digital code range of the first DTC and the second DTC.

At 906, the first output (e.g., $f(Y_1)$) based on the incremented digital code and the second output (e.g., $f(Y_0)$) based on a previous digital code that has not been incremented are received at a phase detector circuit (e.g., 604) and a first time difference of outputs of the first DTC and the second DTC corresponding to the incremented digital code ($\tau_{01}$ in equation (9)) and a second time difference of outputs of the first DTC and the second DTC corresponding to the previous digital code ($\tau_{00}$ in equation (9)) are generated. In some embodiments, the method includes generating the first time difference and the second time difference for each of the code increments for both the first DTC 602a and the second DTC 602b. At 908, a time difference between the first and the second time differences is determined to generate a measurement indicative of the DTC non-linearity of the first DTC and the second DTC.

While the methods are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

While the system and methods has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a system for calibrating a digital to time converter (DTC), comprising a DTC circuit comprising a first DTC configured to receive a first digital input code and generate a first DTC output signal based on the first digital input code; and a second DTC configured to receive a second digital input code and generate a second DTC output signal based on the second digital input code, wherein the first DTC and the second DTC are synchronized with respect to one another via receipt of a same input clock signal; a delay circuit coupled to an output path of the first DTC and configured to apply a first delay to the first DTC output signal to generate a first delayed DTC output signal; a phase detector circuit configured to determine a phase difference between the first delayed DTC output signal and the second DTC output signal, thereby generating a phase detector output; and a calibration circuit configured to adjust the first digital input code of the first DTC to an adjusted first code that minimizes the phase detector output, wherein the adjusted first code has a predetermined relationship with the second input digital code.

Example 2 is a system including the subject matter of example 1, wherein the calibration circuit is further configured to determine a difference between the adjusted first code and the second digital input code, forming a difference code indicative of a non-linearity of the first DTC.

Example 3 is a system including the subject matter of examples 1-2, including or omitting elements, wherein the calibration circuit is further configured to increment the second digital input code of the second DTC to an incremented second code upon minimizing the phase detector output corresponding to the previous second digital input code that has not been incremented.

Example 4 is a system including the subject matter of examples 1-3, including or omitting elements, wherein the calibration circuit is further configured to adjust the first digital input code or the incremented first code or any other code applied to the first DTC that minimizes the phase detector output, when the incremented second code is applied to the second DTC in order to generate a difference code associated therewith.

Example 5 is a system including the subject matter of examples 1-4, including or omitting elements, wherein the calibration circuit is further configured to determine the difference code for a plurality of incremented second codes to generate a plurality of difference codes to cover a whole spectrum of the first DTC.

Example 6 is a system including the subject matter of examples 1-5, including or omitting elements, wherein the delay circuit is further coupled to an output path of the second DTC and configured to apply a second delay to the second DTC output to generate a second delayed DTC output signal.

Example 7 is a system including the subject matter of examples 1-6, including or omitting elements, wherein the calibration circuit is further configured to selectively apply the first delay to the output path of the first DTC in a first mode and a third mode, and selectively bypass the first delay at the output path of the first DTC in a second mode and a fourth mode.

Example 8 is a system including the subject matter of examples 1-7, including or omitting elements, wherein the calibration circuit is further configured to selectively bypass the second delay at the output path of the second DTC in the first mode and the second mode and selectively apply the second delay to the output path of the second DTC in the third mode and the fourth mode.

Example 9 is a system including the subject matter of examples 1-8, including or omitting elements, wherein the calibration circuit is further configured to provide a control signal to a first multiplexer circuit in the output path of the first DTC and a second multiplexer circuit in the output path of the second DTC, to selectively apply the first delay and the second delay to the output paths of the first DTC and the second DTC respectively.

Example 10 is a system including the subject matter of examples 1-9, including or omitting elements, wherein the calibration circuit is further configured to operate the delay circuit in the first mode and the second mode for each of the second digital input code in a first code range of an allowable code range of the second DTC, and operate the delay circuit in the third mode and the fourth mode for each of the second digital input code in a second, different code range of the allowable code range of the second DTC, based on a delay at the output of the second DTC.

Example 11 is a system including the subject matter of examples 1-10, including or omitting elements, wherein the calibration circuit is further configured to determine a first code difference between a first adjusted code at the first DTC in the first mode and a first adjusted code at the first DTC in the second mode to generate a first calibration output for the first DTC, for each of the second digital input code in the first code range of an allowable code range of the second DTC; and determine a second code difference between a first adjusted code at the first DTC in the third mode and a first adjusted code at the first DTC in the fourth mode to generate a second calibration output for the first DTC, for each of the second digital input code in the second code range of an allowable code range of the second DTC.

Example 12 is a method for calibrating a digital to time converter (DTC), comprising generating a first DTC output signal at an output of a first DTC based on a first digital input code; generating a second DTC output signal at an output of a second DTC based on a second digital input code, wherein the first DTC and the second DTC are coupled to one another; applying a first delay to the first DTC output signal using a delay circuit, to generate a first delayed DTC output signal; determining a phase difference between the first delayed DTC output signal and the second DTC output signal at a phase detector circuit, thereby generating a phase detector output; and adjusting the first digital input code of the first DTC to an adjusted first code that minimizes the phase detector output using a calibration circuit, wherein the adjusted first code has a predetermined relationship with the second input digital code.

Example 13 is a method including the subject matter of example 12, further comprising determining a difference between the adjusted first code and the second digital input code, forming a difference code indicative of a non-linearity of the first DTC.

Example 14 is a method including the subject matter of examples 12-13, including or omitting elements, further comprising selectively applying the first delay to the output path of the first DTC in a first mode and a third mode, and selectively bypassing the first delay at the output path of the first DTC in a second mode and a fourth mode.

Example 15 is a method including the subject matter of examples 12-14, including or omitting elements, further comprising selectively bypassing a second delay at the output path of the second DTC in the first mode and the second mode, and selectively applying the second delay to the output path of the second DTC in the third mode and the fourth mode.

Example 16 is a method including the subject matter of examples 12-15, including or omitting elements, further comprising operating the delay circuit in the first mode and the second mode for a plurality of the second digital input codes in a first code range of an allowable code range of the second DTC, and operating the delay circuit in the third mode and the fourth mode for a plurality of the second digital input code in a second, different code range of the allowable code range of the second DTC, based on a delay at the output of the second DTC.

Example 17 is a method including the subject matter of examples 12-16, including or omitting elements, further comprising determining a first code difference between a first adjusted code at the first DTC in the first mode and a first adjusted code at the first DTC in the second mode to generate a first calibration output for the first DTC, for a plurality of the second digital input codes in a first code range of an allowable code range of the second DTC; and determining a second code difference between a first adjusted code at the first DTC in the third mode and a first adjusted code at the first DTC in the fourth mode to generate a second calibration output for the first DTC, for a plurality of the second digital input codes in a second, different code range of an allowable code range of the second DTC.

Example 18 is a system for calibrating a digital to time converter (DTC), comprising a DTC circuit comprising a first DTC and a second DTC coupled to one another and configured to alternately receive an incremented digital code at the first DTC and the second DTC, while keeping the other DTC at a constant code and generate a first output in response to the incremented digital code and generate a second output in response to a previous digital code that is not incremented; a phase detector circuit coupled to the first DTC via a first connection and to the second DTC via a second connection, and configured to receive the first output based on the incremented digital code and the second output based on a previous digital code that has not been incremented; generate a first time difference of outputs of the first DTC and the second DTC corresponding to the incremented digital code; and generate a second time difference of outputs of the first DTC and the second DTC corresponding to the previous digital code; and a calibration circuit configured to determine a measurement associated with a non-linearity of the first DTC and the second DTC, based on the first and the second time differences; and alternately provide the incremented digital code to the first DTC and the second DTC.

Example 19 is a system including the subject matter of example 18, wherein determining the measurement associated with the non-linearity of the DTC comprises determining a time difference between the first and the second time differences, wherein the time difference corresponds to a time delay associated with a code increment around the previous digital code that is not incremented.

Example 20 is a system including the subject matter of examples 18-19, including or omitting elements, wherein the calibration circuit is further configured to determine the incremented digital code to be applied to the first DTC and the second DTC, based on a dynamic range of the phase detector circuit.

Example 21 is a system including the subject matter of examples 18-20, including or omitting elements, wherein the calibration circuit is further configured to provide the incremented digital code to the first DTC and the second DTC, in steps, to cover the whole digital code range of the first DTC and the second DTC.

Example 22 is a system including the subject matter of examples 18-21, including or omitting elements, wherein the phase detector circuit comprises a time to digital converter (TDC).

Example 23 is a method for calibrating a digital to time converter (DTC), comprising alternately receiving an incremented digital code at a first DTC and a second DTC that are coupled to one another from a calibration circuit, while keeping the other DTC at a constant code and generating a first output in response to the incremented digital code and generating a second output in response to a previous digital code that is not incremented; receiving the first output based on the incremented digital code and the second output based on a previous digital code that has not been incremented at a phase detector circuit and generating a first time difference of outputs of the first DTC and the second DTC corresponding to the incremented digital code and generating a second time difference of outputs of the first DTC and the second DTC corresponding to the previous digital code; and determining a measurement associated with a non-linearity of the first DTC and the second DTC, based on the first and the second time differences at a calibration circuit.

Example 24 is a method including the subject matter of example 23, wherein determining the measurement associated with the non-linearity of the DTC comprises determining a time difference between the first and the second time differences, wherein the time difference corresponds to a time delay associated with a code increment around the previous digital code that is not incremented.

Example 25 is a method including the subject matter of examples 23-24, including or omitting elements, further comprising receiving the incremented digital code at the first DTC and the second DTC from the calibration circuit, in a plurality of cycles, to cover the whole digital code range of the first DTC and the second DTC.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

The invention claimed is:

1. A system for calibrating a digital to time converter (DTC), comprising:
   a DTC circuit comprising:
      a first DTC configured to receive a first digital input code and generate a first DTC output signal based on the first digital input code; and
      a second DTC configured to receive a second digital input code and generate a second DTC output signal based on the second digital input code, wherein the first DTC and the second DTC are synchronized with respect to one another via receipt of a same input clock signal;
   a delay circuit coupled to an output path of the first DTC and configured to apply a first delay to the first DTC output signal to generate a first delayed DTC output signal;
   a phase detector circuit configured to determine a phase difference between the first delayed DTC output signal and the second DTC output signal, thereby generating a phase detector output; and
   a calibration circuit configured to adjust the first digital input code of the first DTC to an adjusted first code that minimizes the phase detector output, wherein the adjusted first code has a predetermined relationship with the second input digital code.

2. The system of claim 1, wherein the calibration circuit is further configured to determine a difference between the adjusted first code and the second digital input code, forming a difference code indicative of a non-linearity of the first DTC.

3. The system of claim 2, wherein the calibration circuit is further configured to increment the second digital input code of the second DTC to an incremented second code upon minimizing the phase detector output corresponding to the previous second digital input code that has not been incremented.

4. The system of claim 3, wherein the calibration circuit is further configured to adjust the first digital input code or the adjusted first code or any other code applied to the first DTC that minimizes the phase detector output, when the incremented second code is applied to the second DTC in order to generate a difference code associated therewith.

5. The system of claim 4, wherein the calibration circuit is further configured to determine the difference code for a plurality of incremented second codes to generate a plurality of difference codes to cover a whole spectrum of the first DTC.

6. The system of claim 1, wherein the delay circuit is further coupled to an output path of the second DTC and configured to apply a second delay to the second DTC output to generate a second delayed DTC output signal.

7. The system of claim 6, wherein the calibration circuit is further configured to selectively apply the first delay to the output path of the first DTC in a first mode and a third mode, and selectively bypass the first delay at the output path of the first DTC in a second mode and a fourth mode.

8. The system of claim 7, wherein the calibration circuit is further configured to selectively bypass the second delay at the output path of the second DTC in the first mode and the second mode and selectively apply the second delay to the output path of the second DTC in the third mode and the fourth mode.

9. The system of claim 8, wherein the calibration circuit is further configured to provide a control signal to a first multiplexer circuit in the output path of the first DTC and a second multiplexer circuit in the output path of the second DTC, to selectively apply the first delay and the second delay to the output paths of the first DTC and the second DTC respectively.

10. The system of claim 8, wherein the calibration circuit is further configured to operate the delay circuit in the first mode and the second mode for each of the second digital input code in a first code range of an allowable code range of the second DTC, and operate the delay circuit in the third mode and the fourth mode for each of the second digital input code in a second, different code range of the allowable code range of the second DTC, based on a delay at the output of the second DTC.

11. The system of claim 10, wherein the calibration circuit is further configured to:
determine a first code difference between a first adjusted code at the first DTC in the first mode and a first adjusted code at the first DTC in the second mode to generate a first calibration output for the first DTC, for each of the second digital input code in the first code range of an allowable code range of the second DTC; and
determine a second code difference between a first adjusted code at the first DTC in the third mode and a first adjusted code at the first DTC in the fourth mode to generate a second calibration output for the first DTC, for each of the second digital input code in the second code range of an allowable code range of the second DTC.

12. A method for calibrating a digital to time converter (DTC), comprising:
generating a first DTC output signal at an output of a first DTC based on a first digital input code;
generating a second DTC output signal at an output of a second DTC based on a second digital input code, wherein the first DTC and the second DTC are coupled to one another;
applying a first delay to the first DTC output signal using a delay circuit, to generate a first delayed DTC output signal;
determining a phase difference between the first delayed DTC output signal and the second DTC output signal at a phase detector circuit, thereby generating a phase detector output; and
adjusting the first digital input code of the first DTC to an adjusted first code that minimizes the phase detector output using a calibration circuit, wherein the adjusted first code has a predetermined relationship with the second input digital code.

13. The method of claim 12, further comprising determining a difference between the adjusted first code and the second digital input code, forming a difference code indicative of a non-linearity of the first DTC.

14. The method of claim 12, further comprising selectively applying the first delay to an output path of the first DTC in a first mode and a third mode, and selectively bypassing the first delay at the output path of the first DTC in a second mode and a fourth mode.

15. The method of claim 14, further comprising selectively bypassing a second delay at an output path of the second DTC in the first mode and the second mode, and selectively applying the second delay to the output path of the second DTC in the third mode and the fourth mode.

16. The method of claim 15, further comprising operating the delay circuit in the first mode and the second mode for a plurality of the second digital input codes in a first code range of an allowable code range of the second DTC, and operating the delay circuit in the third mode and the fourth mode for a plurality of the second digital input code in a second, different code range of the allowable code range of the second DTC, based on a delay at the output of the second DTC.

17. The method of claim 16, further comprising:
determining a first code difference between a first adjusted code at the first DTC in the first mode and a first adjusted code at the first DTC in the second mode to generate a first calibration output for the first DTC, for a plurality of the second digital input codes in a first code range of an allowable code range of the second DTC; and
determining a second code difference between a first adjusted code at the first DTC in the third mode and a first adjusted code at the first DTC in the fourth mode to generate a second calibration output for the first DTC, for a plurality of the second digital input codes in a second, different code range of an allowable code range of the second DTC.

18. A system for calibrating a digital to time converter (DTC), comprising:
a DTC circuit comprising:
a first DTC and a second DTC coupled to one another and configured to alternately receive an incremented digital code at the first DTC and the second DTC, while keeping the other DTC at a constant code and generate a first output in response to the incremented digital code and generate a second output in response to a previous digital code that is not incremented;
a phase detector circuit coupled to the first DTC via a first connection and to the second DTC via a second connection, and configured to:
receive the first output based on the incremented digital code and the second output based on a previous digital code that has not been incremented;
generate a first time difference of outputs of the first DTC and the second DTC corresponding to the incremented digital code; and
generate a second time difference of outputs of the first DTC and the second DTC corresponding to the previous digital code; and
a calibration circuit configured to:
determine a measurement associated with a non-linearity of the first DTC and the second DTC, based on the first and the second time differences; and
alternately provide the incremented digital code to the first DTC and the second DTC.

19. The system of claim 18, wherein determining the measurement associated with the non-linearity of the DTC comprises determining a time difference between the first and the second time differences, wherein the time difference corresponds to a time delay associated with a code increment around the previous digital code that is not incremented.

20. The system of claim 18, wherein the calibration circuit is further configured to determine the incremented digital code to be applied to the first DTC and the second DTC, based on a dynamic range of the phase detector circuit.

21. The system of claim 18, wherein the calibration circuit is further configured to provide the incremented digital code to the first DTC and the second DTC, in steps, to cover the whole digital code range of the first DTC and the second DTC.

22. The system of claim 18, wherein the phase detector circuit comprises a time to digital converter (TDC).

23. A method for calibrating a digital to time converter (DTC), comprising:
 alternately receiving an incremented digital code at a first DTC and a second DTC that are coupled to one another from a calibration circuit, while keeping the other DTC at a constant code and generating a first output in response to the incremented digital code and generating a second output in response to a previous digital code that is not incremented;
 receiving the first output based on the incremented digital code and the second output based on a previous digital code that has not been incremented at a phase detector circuit and generating a first time difference of outputs of the first DTC and the second DTC corresponding to the incremented digital code and generating a second time difference of outputs of the first DTC and the second DTC corresponding to the previous digital code; and
 determining a measurement associated with a non-linearity of the first DTC and the second DTC, based on the first and the second time differences at a calibration circuit.

24. The method of claim 23, wherein determining the measurement associated with the non-linearity of the DTC comprises determining a time difference between the first and the second time differences, wherein the time difference corresponds to a time delay associated with a code increment around the previous digital code that is not incremented.

25. The method of claim 23, further comprising receiving the incremented digital code at the first DTC and the second DTC from the calibration circuit, in a plurality of cycles, to cover the whole digital code range of the first DTC and the second DTC.

* * * * *